US010958413B2

(12) United States Patent
Li et al.

(10) Patent No.: US 10,958,413 B2
(45) Date of Patent: Mar. 23, 2021

(54) SIGNAL TRANSMISSION METHOD AND SYSTEM AND RETIMER

(71) Applicant: Huawei Technologies Co., Ltd., Shenzhen (CN)

(72) Inventors: Yongyao Li, Chengdu (CN); Jiankang Li, Chengdu (CN); Jun Yu, Chengdu (CN); Jiang Zhu, Chengdu (CN); Fei Luo, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/533,365

(22) Filed: Aug. 6, 2019

(65) Prior Publication Data
US 2019/0363869 A1 Nov. 28, 2019

Related U.S. Application Data

(63) Continuation of application No. PCT/CN2018/114191, filed on Nov. 6, 2018.

(30) Foreign Application Priority Data

Feb. 11, 2018 (CN) .......................... 201810143182.6

(51) Int. Cl.
H03H 7/30 (2006.01)
H04L 7/033 (2006.01)
(Continued)

(52) U.S. Cl.
CPC .......... *H04L 7/0331* (2013.01); *H04L 1/0002* (2013.01); *H04L 7/0058* (2013.01); *H04L 25/03057* (2013.01); *H04L 69/24* (2013.01)

(58) Field of Classification Search
CPC ... H04L 7/0331; H04L 1/0002; H04L 7/0058; H04L 25/03057; H04L 69/24;
(Continued)

(56) References Cited

U.S. PATENT DOCUMENTS 9,166,846 B1 10/2015 Lee et al.
2005/0227629 A1* 10/2005 Ali ........................... H03L 7/22
455/73

(Continued)

FOREIGN PATENT DOCUMENTS

CN 1909418 A 2/2007
CN 101183995 A 5/2008
(Continued)

Primary Examiner — Dhaval V Patel
(74) Attorney, Agent, or Firm — Leydig, Voit & Mayer, Ltd.

(57) ABSTRACT

A retimer is provided. The retimer includes: a data channel circuit, configured to implement, under a function of a current phase locked loop, equalization processing-based transparent transmission of a signal between a first communications device and a second communications device; and the link adjustment circuit, configured to: when determining, based on link status information of the data channel circuit, that a rate of a link needs to be changed, configure an operating parameter of a target phase locked loop as an operating parameter corresponding to a changed rate; and switch the currently used phase locked loop to the target phase locked loop when detecting that the link enters a rate-changing state, where the data channel circuit is further configured to implement, under a function of the target phase locked loop, the transparent transmission of a signal between the first communications device and the second communications device.

17 Claims, 6 Drawing Sheets

(51) Int. Cl.
*H04L 1/00* (2006.01)
*H04L 7/00* (2006.01)
*H04L 25/03* (2006.01)
*H04L 29/06* (2006.01)

(58) Field of Classification Search
CPC ... H04L 41/0823; H04L 43/0894; H03L 7/22; H03L 7/07; H03L 7/1077
See application file for complete search history.

(56) References Cited

U.S. PATENT DOCUMENTS

| | | |
|---|---|---|
| 2011/0188621 A1 | 8/2011 | Asaduzzaman et al. |
| 2013/0093482 A1 | 4/2013 | Asaduzzaman et al. |
| 2014/0043075 A1* | 2/2014 | Sasaki ............... H03L 7/08 327/158 |
| 2014/0285245 A1* | 9/2014 | Sahara ............... H03L 7/14 327/147 |
| 2015/0207514 A1* | 7/2015 | Kim ............... H03L 7/18 455/73 |
| 2015/0222389 A1 | 8/2015 | Bae et al. |
| 2016/0182257 A1 | 6/2016 | Froelich et al. |
| 2016/0196233 A1 | 7/2016 | Chen et al. |
| 2017/0017604 A1* | 1/2017 | Chen ............... G06F 11/3027 |
| 2017/0262401 A1 | 9/2017 | Chen et al. |
| 2017/0262402 A1 | 9/2017 | Chen et al. |
| 2017/0262403 A1 | 9/2017 | Chen et al. |
| 2017/0366468 A1 | 12/2017 | Shoor et al. |
| 2017/0371831 A1 | 12/2017 | Sharma |
| 2018/0004686 A1 | 1/2018 | Chen |

FOREIGN PATENT DOCUMENTS

| | | |
|---|---|---|
| CN | 104639899 A | 5/2015 |
| CN | 108418582 A | 8/2018 |

* cited by examiner

SIGNAL TRANSMISSION METHOD AND SYSTEM AND RETIMER

CROSS-REFERENCE TO RELATED APPLICATIONS

This application is a continuation application of international patent application number PCT/CN2018/114191, filed on Nov. 6, 2018, which claims priority to Chinese Patent Application No. 201810143182.6, filed on Feb. 11, 2018. The disclosures of the aforementioned applications are hereby incorporated by reference in their entireties.

TECHNICAL FIELD

Embodiments of this application relate to the field of electronic information technologies, and more specifically, relate to a signal transmission method and system and a retimer.

BACKGROUND

A delay of data transmission between different communications devices has large impact on user experience. In addition, emergence of high real-time application scenarios such as self-driving and facial recognition places a higher requirement for a low delay of data transmission between different communications devices.

Currently, a feasible solution is using a panel or a cable with a low link loss. However, using a panel or a cable to reduce a link loss causes an increase of costs. A low-loss panel and an extremely low-loss panel that are frequently used are used as an example, and costs of the latter is about 4 to 6 times that of the former. In addition, using a panel can resolve only a problem of interconnection within a specific length range due to limitation of panel performance. For example, the extremely low-loss panel supports the Peripheral Component Interconnect Express (PCIe) 4.0, and supports a maximum length of about 20 inches.

Reducing a delay of data transmission between different communications devices is an urgent problem that needs to be resolved.

SUMMARY

This application provides a signal transmission method and system and a retimer, to resolve a problem existing in the prior art that an internal delay of a retimer for link equalization is relatively long.

According to a first aspect, an embodiment of this application provides a retimer for link equalization, and the retimer includes: the data channel circuit, configured to implement, under a function of a current phase locked loop, equalization processing-based transparent transmission of a signal between a first communications device and a second communications device; and the link adjustment circuit, configured to obtain a signal transmitted in the data channel circuit, where the link adjustment circuit is configured to obtain link status information based on the obtained signal; the link adjustment circuit is further configured to: when determining, based on the link status information, that a rate of a link needs to be changed, configure an operating parameter of a target phase locked loop as an operating parameter corresponding to a changed rate, where the target phase locked loop is an unused phase locked loop in at least two phase locked loops; the link adjustment circuit is further configured to switch the currently used phase locked loop to the target phase locked loop when detecting that the link enters a rate-changing state; and the data channel circuit is further configured to implement, under a function of the target phase locked loop, the transparent transmission of a signal between the first communications device and the second communications device. In the foregoing technical solution, the data channel circuit transparently transmits the signal. In a process in which the signal is transmitted in the data channel circuit, a series of operations such as serial-to-parallel conversion, coding/decoding, and buffering do not need to be performed on the signal. Therefore, a transmission delay of the signal in the data channel circuit is relatively short. The retimer further includes a plurality of phase locked loops. When determining that the rate of the link needs to be changed, the link adjustment circuit may configure the operating parameter of the target phase locked loop as the operating parameter corresponding to the changed rate. In other words, when the link adjustment circuit configures the operating parameter of the target phase locked loop as the operating parameter corresponding to the changed rate, the rate of the link only needs to be changed and has not been changed. To be specific, the retimer includes the plurality of phase locked loops, and therefore the link adjustment circuit may configure an operating parameter of an unused phase locked loop in advance, and switch the currently used phase locked loop to the unused phase locked loop when the unused phase locked loop is required to operate with the operating parameter. In this way, a delay caused by phase locked loop adjustment may be reduced when a rate is changed, so as to meet rate-changing requirements of various protocols.

With reference to the first aspect, in a possible implementation of the first aspect, the link adjustment circuit is further configured to perform equalization adjustment when determining, based on the link status information, that the link is in an equalized state. A bit error occurring when a signal is transmitted normally may be avoided by performing equalization adjustment.

With reference to the first aspect, in a possible implementation of the first aspect, the data channel circuit includes a clock and data recovery circuit, an output buffer, and an equalization circuit. The link adjustment circuit is specifically configured to perform equalization adjustment on the equalization circuit when determining, based on the link status information, that the link is in the equalized state. A bit error occurring when a signal is transmitted normally may be avoided by performing equalization adjustment.

With reference to the first aspect, in a possible implementation of the first aspect, the equalization circuit includes at least one of a receive equalization circuit, a transmit equalization circuit, or a decision feedback equalization circuit. The link adjustment circuit is specifically configured to perform equalization adjustment on the receive equalization circuit when determining, based on the link status information, that the link is in the equalized state; the link adjustment circuit is specifically configured to adjust the receive equalization circuit when determining, based on the link status information, that the link is in the equalized state; and/or the link adjustment circuit is specifically configured to adjust the decision feedback equalization circuit when determining, based on the link status information, that the link is in the equalized state. The receive equalization circuit can operate with a proper operating parameter after the receive equalization circuit is adjusted, so as to reduce a component of a low frequency signal, enlarge a component around a Nyquist frequency, and filter out a relatively high frequency, thereby improving quality of a received signal.

The transmit equalization circuit can operate with a proper operating parameter after the transmit equalization circuit is adjusted, so as to compensate for signal distortion that is caused by a channel loss when a signal is transmitted on a physical channel. The decision feedback equalization circuit can operate with a proper operating parameter after the DFE circuit is adjusted, so as to reduce or even eliminate signal distortion that is caused by interference and discontinuous impedance when a signal is transmitted on a physical channel.

With reference to the first aspect, in a possible implementation of the first aspect, the link adjustment circuit is further configured to determine a target equalization parameter value when detecting that the link enters the rate-changing state, where the target equalization parameter value is an equalization parameter value corresponding to the changed rate, and the target equalization parameter value is positively correlated with the changed rate. In the foregoing technical solution, it can be ensured that the link operates stably.

With reference to the first aspect, in a possible implementation of the first aspect, the link adjustment circuit is further configured to configure the data channel circuit when detecting that the first communications device is connected to the retimer and the second communications device is connected to the retimer, so that a first negotiation signal from the first communications device can be transmitted to the second communications device in a transparent transmission manner, a second negotiation signal from the second communications device can be transmitted to the first communications device in the transparent transmission manner, and the first communications device and the second communications device complete a negotiation procedure by using the first negotiation signal and the second negotiation signal. In this way, the first communications device and the second communications device may directly negotiate with each other, to reduce a delay caused when the link adjustment circuit participates in the negotiation.

Each of the foregoing circuits may be implemented based on an ASIC. In this way, and is more convenient to be implemented than a discrete component.

In this application, when there are more than two unused phase locked loops, parameters corresponding to specific rates may be configured for these unused phase locked loops in advance. When a target rate needs to be switched to, a phase locked loop that is corresponding to the target rate and that is configured in advance can be switched to. A larger quantity of phase locked loops may be configured in advance to further reduce a processing delay caused when phase locked loops with different frequencies need to be used, thereby meeting an application scenario in which a rate is frequently changed.

According to a second aspect, an embodiment of this application provides a link adjustment circuit, and the link adjustment circuit includes a link status circuit and a phase locked loop control circuit, where the link status circuit is configured to obtain a signal transmitted in a data channel circuit; the link status circuit is further configured to obtain link status information based on the obtained signal; the link status circuit is further configured to determine, based on the link status information, that a rate of a link needs to be changed; the phase locked loop control circuit is configured to: when the link status circuit determines that the rate of the link needs to be changed, configure an operating parameter of a target phase locked loop as an operating parameter corresponding to a changed rate, where the target phase locked loop is an unused phase locked loop in at least two phase locked loops; the link status circuit is further configured to detect that the link enters a rate-changing state; and the phase locked loop control circuit is further configured to switch a currently used phase locked loop to the target phase locked loop when the link status circuit detects that the link enters the rate-changing state. In the foregoing technical solution, when determining that the rate of the link needs to be changed, the link adjustment circuit may configure an operating parameter of an unused phase locked loop as the operating parameter corresponding to the changed rate in advance. In other words, when the link adjustment circuit configures the operating parameter of the target phase locked loop as the operating parameter corresponding to the changed rate, the rate of the link only needs to be changed and has not been changed. To be specific, the retimer includes a plurality of phase locked loops, and therefore the link adjustment circuit may configure, in advance, the operating parameter of the phase locked loop that does not operate, and switch the currently used phase locked loop to the unused phase locked loop when the unused phase locked loop is required to operate with the operating parameter. In this way, a delay caused by phase locked loop adjustment may be reduced.

With reference to the second aspect, in a possible implementation of the second aspect, the link adjustment circuit further includes a link equalization control circuit; the link status circuit is further configured to determine, based on the link status information, that the link is in an equalized state; and the link equalization control circuit is configured to perform equalization adjustment when the link status circuit determines that the link is in the equalized state. A bit error occurring when a signal is transmitted normally may be avoided by performing equalization adjustment.

With reference to the second aspect, in a possible implementation of the second aspect, the link equalization control circuit is further configured to determine a target equalization parameter value when the link status circuit detects that the link enters the rate-changing state, where the target equalization parameter value is an equalization parameter value corresponding to the changed rate, and the target equalization parameter value is positively correlated with the changed rate. In the foregoing technical solution, it can be ensured that the link operates stably.

With reference to the second aspect, in a possible implementation of the second aspect, the link status circuit is further configured to configure the data channel circuit when detecting that a first communications device is connected to the data channel circuit and a second communications device is connected to the data channel circuit, so that a first negotiation signal from the first communications device can be transmitted to the second communications device in a transparent transmission manner, a second negotiation signal from the second communications device can be transmitted to the first communications device in the transparent transmission manner, and the first communications device and the second communications device complete a negotiation procedure by using the first negotiation signal and the second negotiation signal. In this way, the first communications device and the second communications device may directly negotiate with each other, to reduce a delay caused when the link adjustment circuit participates in the negotiation.

According to a third aspect, an embodiment of this application provides a signal transmission method, the method is performed by a retimer for link equalization, and the method includes: implementing equalization processing-based transparent transmission of a signal between a first communications device and a second communications device; obtaining a transmitted signal; obtaining link status information based on the obtained signal; when it is determined, based on the link status information, that a rate of a link needs to be changed, configuring an operating parameter of a target phase locked loop as an operating parameter corresponding to a changed rate, where the target phase locked loop is an unused phase locked loop in at least two phase locked loops; and switching a currently used phase locked loop to the target phase locked loop when it is detected that the link enters a rate-changing state. In the foregoing technical solution, the signal is transparently transmitted. In a process in which the signal is transmitted, a series of operations such as serial-to-parallel conversion, coding/decoding, and buffering do not need to be performed on the signal. Therefore, a transmission delay of the signal is relatively short. In addition, in the method, when it is determined that the rate of the link needs to be changed, the operating parameter of the target phase locked loop may be configured as the operating parameter corresponding to the changed rate. In other words, when the operating parameter of the target phase locked loop is configured as the operating parameter corresponding to the changed rate, the rate of the link only needs to be changed and has not been changed. To be specific, the retimer includes a plurality of phase locked loops, and therefore an operating parameter of the phase locked loop that does not operate may be configured in advance, and the currently used phase locked loop is switched to the unused phase locked loop when the unused phase locked loop is required to operate with the operating parameter. In this way, a delay caused by phase locked loop adjustment may be reduced.

With reference to the third aspect, in a possible implementation of the third aspect, the method further includes: performing equalization adjustment when it is determined, based on the link status information, that the link is in an equalized state. A bit error occurring when a signal is transmitted normally may be avoided by performing equalization adjustment.

With reference to the third aspect, in a possible implementation of the third aspect, the method further includes: determining a target equalization parameter value when it is detected that the link enters the rate-changing state, where the target equalization parameter value is an equalization parameter value corresponding to the changed rate, and the target equalization parameter value is positively correlated with the changed rate. In the foregoing technical solution, it can be ensured that the link operates stably.

With reference to the third aspect, in a possible implementation of the third aspect, the method further includes: configuring the retimer when it is detected that the first communications device is connected to the retimer and the second communications device is connected to the retimer, so that a first negotiation signal from the first communications device can be transmitted to the second communications device in a transparent transmission manner, a second negotiation signal from the second communications device can be transmitted to the first communications device in the transparent transmission manner, and the first communications device and the second communications device complete a negotiation procedure by using the first negotiation signal and the second negotiation signal. In this way, the first communications device and the second communications device may directly negotiate with each other, to reduce a delay caused when the link adjustment circuit participates in the negotiation.

According to a fourth aspect, an embodiment of this application provides a signal transmission system, and the system includes a first communications device, a second communications device, and at least one retimer for link equalization in the first aspect or any possible implementation of the first aspect, where the first communications device is configured to send a first signal to the retimer; the retimer is configured to transmit the first signal to the second communications device in a transparent transmission manner; the second communications device is configured to send a second signal to the retimer; and the retimer is further configured to transmit the second signal to the first communications device in the transparent transmission manner.

According to a fifth aspect, an embodiment of this application provides a retimer for link equalization, and the retimer includes a data channel circuit, a link adjustment circuit, and a phase locked loop, where the data channel circuit is configured to implement equalization processing-based transparent transmission of a signal between a first communications device and a second communications device; the link adjustment circuit is configured to obtain a signal transmitted in the data channel circuit; the link adjustment circuit is configured to obtain link status information based on the obtained signal; the link adjustment circuit is further configured to: when determining, based on the link status information, that a rate of a link needs to be changed, configure an operating parameter of the phase locked loop as an operating parameter corresponding to a changed rate; and the link adjustment circuit is further configured to: when detecting that the link enters a rate-changing state, switch the operating parameter of the phase locked loop to the operating parameter corresponding to the changed rate. In the foregoing technical solution, the data channel circuit transparently transmits the signal. In a process in which the signal is transmitted in the data channel circuit, a series of operations such as serial-to-parallel conversion, coding/decoding, and buffering do not need to be performed on the signal. Therefore, a transmission delay of the signal in the data channel circuit is relatively short.

With reference to the fifth aspect, in a possible implementation of the fifth aspect, the link adjustment circuit is further configured to perform equalization adjustment when determining, based on the link status information, that the link is in an equalized state. A bit error occurring when a signal is transmitted normally may be avoided by performing equalization adjustment.

With reference to the fifth aspect, in a possible implementation of the fifth aspect, the link adjustment circuit is further configured to determine a target equalization parameter value when detecting that the link enters the rate-changing state, where the target equalization parameter value is an equalization parameter value corresponding to the changed rate, and the target equalization parameter value is positively correlated with the changed rate. In the foregoing technical solution, it can be ensured that the link operates stably.

With reference to the fifth aspect, in a possible implementation of the fifth aspect, the link adjustment circuit is further configured to configure the data channel circuit when detecting that the first communications device is connected to the retimer and the second communications device is connected to the retimer, so that a first negotiation signal from the first communications device can be transmitted to the second communications device in a transparent transmission manner, a second negotiation signal from the second communications device can be transmitted to the first communications device in the transparent transmission manner, and the first communications device and the second communications device complete a negotiation procedure by using the first negotiation signal and the second negotiation signal. In this way, the first communications device and the second communications device may directly negotiate with each other, to reduce a delay caused when the link adjustment circuit participates in the negotiation.

According to a sixth aspect, an embodiment of this application provides a computer readable storage medium. The computer readable storage medium stores an instruction, and when the instruction runs in a computer, the computer performs the methods in the foregoing aspects.

According to a seventh aspect, an embodiment of this application provides a computer program product including an instruction, and when the computer program product runs in a computer, the computer performs the methods in the foregoing aspects.

DESCRIPTION OF EMBODIMENTS

The following describes technical solutions of this application with reference to accompanying drawings.

A communications device in the embodiments of this application may be any communications device that can conform to at least one interface protocol or at least one bus protocol. The communications device may be a chip, a circuit, or the like.

Two communications devices may communicate with each other by using an interface protocol or a bus protocol. Unless otherwise specified, in the embodiments of this application, any two communications devices in two communications devices, different communications devices, at least one communications device, and the like need to conform to a same interface protocol or a same bus protocol.

The two communications devices may be devices of different types. For example, one communications device may be a central processing unit (CPU), and the other communications device may be a graphics processing unit (GPU). For another example, one communications device may be a CPU, and the other communications device may be a network adapter.

A link in the embodiments of this application may be a communication link for transmitting a specific communications protocol.

Figure 1:
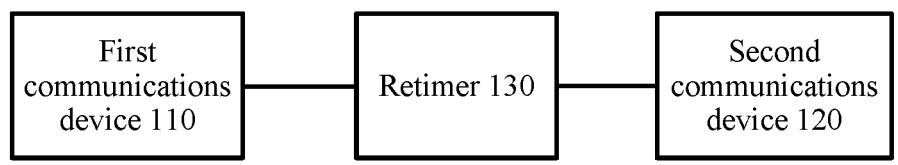
FIG. 1 is a schematic structural diagram of a signal transmission system according to an embodiment of this application.

FIG. 1 is a schematic structural diagram of a signal transmission system according to an embodiment of this application. A system 100 shown in FIG. 1 includes a first communications device 110, a second communications device 120, and a retimer 130 for link equalization.

The first communications device 110 may be connected to the retimer 130. The second communications device 120 may be connected to the retimer 130. The first communications device 110 and the second communications device 120 conform to a same interface protocol or a same bus protocol. For example, both the first communications device 110 and the second communications device 120 conform to a PCIe protocol, a serial advanced technology attachment (SATA) interface protocol, a cache coherent interconnect for accelerators (CCIX) interface protocol, a serial attached small computer system interface (SAS) protocol, and a Universal Serial Bus (USB) protocol.

A first signal from the first communications device 110 is output to the second communications device 120 after passing through the retimer 130. A second signal from the second communications device 120 is output to the first communications device 110 after passing through the retimer 130.

The system 100 shown in FIG. 1 includes only one retimer 130. In some embodiments, the signal transmission system may include two or more retimers 130.

Figure 2:
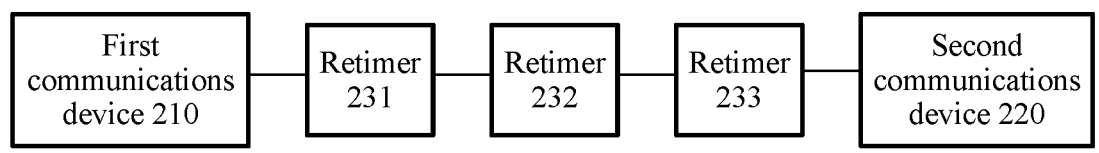
FIG. 2 is a schematic structural diagram of another signal transmission system according to an embodiment of this application.

FIG. 2 is a schematic structural diagram of another signal transmission system according to an embodiment of this application. A system 200 shown in FIG. 2 includes a first communications device 210, a second communications device 220, and three retimers for link equalization: a retimer 231, a retimer 232, and a retimer 233.

The first communications device 210 may be connected to the retimer 231. The second communications device 220 may be connected to the retimer 231. The first communications device 210 may be connected to the retimer 232. The second communications device 220 may be connected to the retimer 232. The first communications device 210 may be connected to the retimer 233. The second communications device 220 may be connected to the retimer 233.

In some other embodiments, the signal transmission system may include two or more than three retimers. A structure of the signal transmission system including two or more than three retimers is similar to that in FIG. 1 and FIG. 2, and therefore such structures are unnecessarily listed one by one. In the system, a larger quantity of retimers between the first communications device and the second communications device indicates a longer distance at which performance of transmission between the first communications device and the second communications device can remain unchanged.

Figure 3:
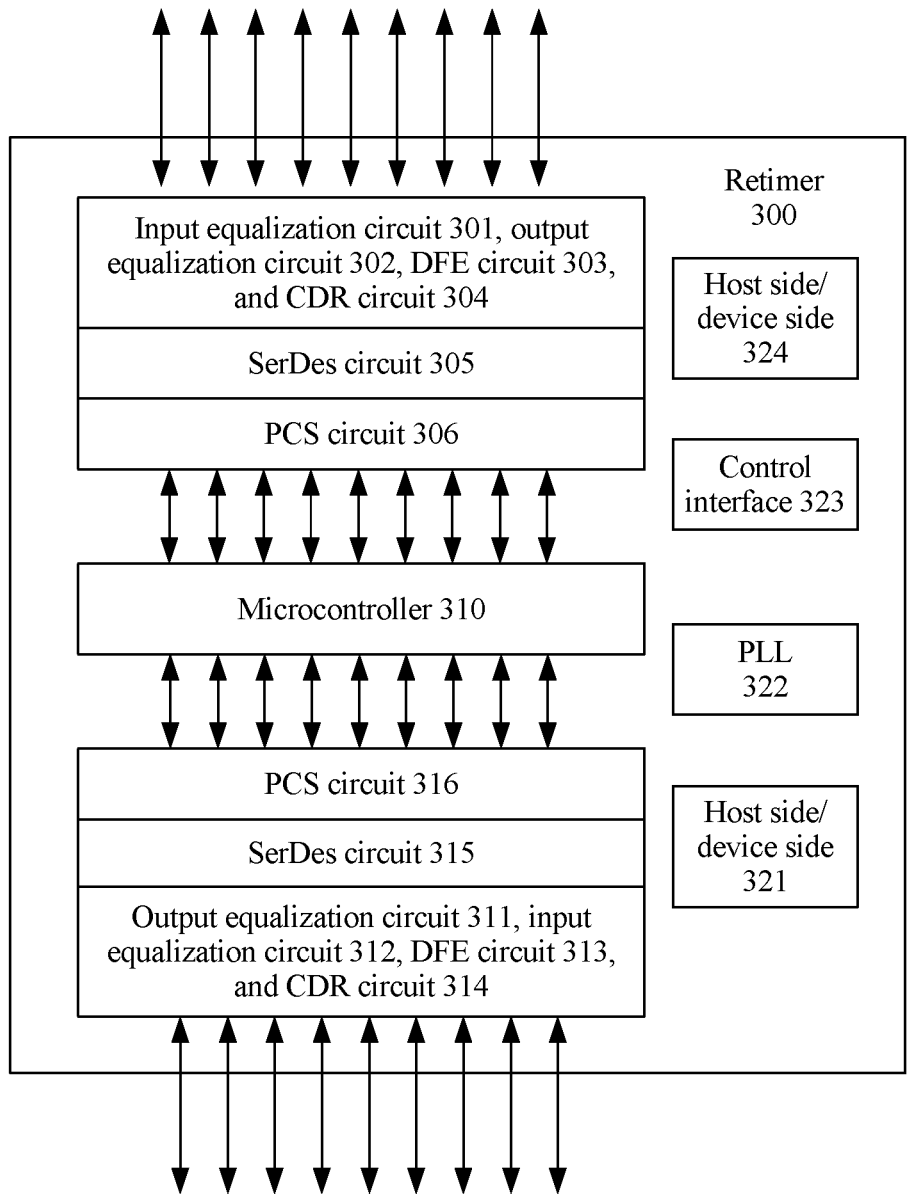
FIG. 3 is a schematic structural block diagram of a retimer for link equalization.

FIG. 3 is a schematic structural diagram of a retimer for link equalization. A retimer 300 shown in FIG. 3 includes a receive equalization circuit 301, a transmit equalization circuit 302, a decision feedback equalization (DFE) circuit 303, a clock and data recovery (CDR) circuit 304, a serializer/deserializer (SerDes) circuit 305, a PCS circuit 306, a microcontroller 310, a transmit equalization circuit 311, a receive equalization circuit 312, a DFE circuit 313, a CDR circuit 314, a SerDes circuit 315, a PCS circuit 316, a host side/device side 321, a phase locked loop (PLL) 322, a control interface 323, and a host side/device side 324.

The retimer 300 shown in FIG. 3 may be applied to the system 100 shown in FIG. 1 or the system 200 shown in FIG. 2. The system 100 is used as an example. A signal from the first communications device 110 sequentially passes through the receive equalization circuit 301, the DFE circuit 303, the CDR circuit 304, the SerDes circuit 305, the physical coding sublayer (PCS) circuit 306, the microcontroller 310, the PCS circuit 316, the SerDes circuit 315, and the transmit equalization circuit 311.

A signal from the second communications device 120 sequentially passes through the receive equalization circuit 312, the DFE circuit 313, the CDR circuit 314, the SerDes circuit 315, the PCS circuit 316, the microcontroller 310, the PCS circuit 306, the SerDes circuit 305, and the transmit equalization circuit 302.

The CDR circuit is configured to extract time sequence information such as a clock from an obtained signal, and retime the signal by using the extracted time sequence information, to eliminate jitters of the signal that are accumulated in a transmission process.

The receive equalization circuit may be a continuous time linear equalizer (CTLE). The receive equalization circuit may be used to reduce a component of a low frequency signal, enlarge a component around a Nyquist frequency, and filter out a relatively high frequency, to improve quality of a received signal.

The transmit equalization circuit is configured to compensate for signal distortion that is caused by a channel loss when a signal is transmitted on a physical channel. This may be usually implemented by using a feed forward equalization (FEE) technology.

The PCS circuit 306 and the microcontroller 310 are configured to negotiate with a first communications device connected to the retimer 300. The PCS circuit 316 and the microcontroller 310 negotiate with a second communications device connected to the retimer 300. In other words, the first communications device and the second communications device separately negotiate with the retimer 300. After completing a negotiation process, the first communications device and the second communications device may transmit data to each other by passing through the retimer.

Figure 4:
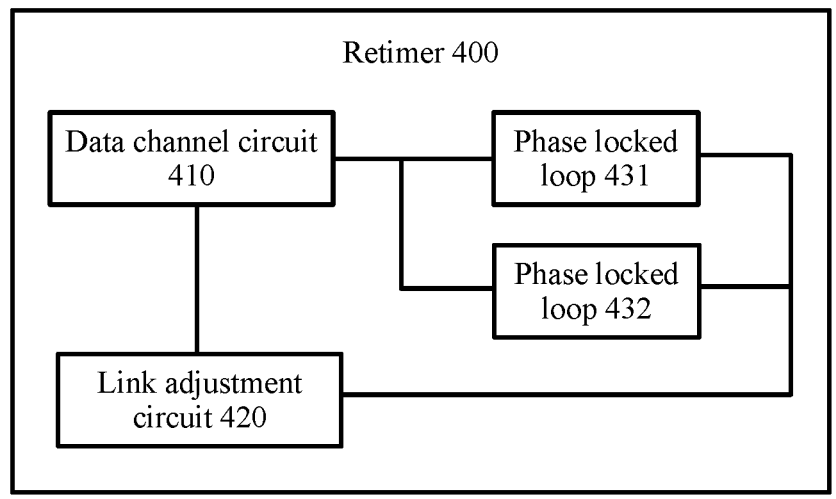
FIG. 4 is a structural block diagram of a retimer for link equalization according to an embodiment of this application.

FIG. 4 is a structural block diagram of a retimer for link equalization according to an embodiment of this application. A retimer 400 shown in FIG. 4 includes a data channel circuit 410, a link adjustment circuit 420, and two phase locked loops: a phase locked loop 431 and a phase locked loop 432.

The data channel circuit 410 is configured to implement, under a function of a current phase locked loop, equalization processing-based transparent transmission of a signal between a first communications device and a second communications device.

The data channel circuit 410 includes a CDR circuit. The CDR circuit may perform equalization processing on a transmitted signal. Specifically, the CDR circuit may extract time sequence information such as a clock from an obtained signal, and retime the signal by using the extracted time sequence information, to eliminate jitters of the signal that are accumulated in a transmission process.

A frequency of the phase locked loop may be multiplied to a frequency of an operating rate based on an externally input reference clock, and the frequency is provided for the CDR circuit in the data channel circuit 410 for phase adjustment, so as to quickly lock a signal.

Optionally, in some embodiments, the data channel circuit 410 further includes an equalization circuit. The equalization circuit may include at least one of a receive equalization circuit, a transmit equalization circuit, or a decision feedback equalization (DFE) circuit.

Optionally, in some embodiments, the equalization circuit included in the data channel circuit 410 may include only the receive equalization circuit.

Optionally, in some other embodiments, the equalization circuit included in the data channel circuit 410 may include only the transmit equalization circuit.

Optionally, in some other embodiments, the equalization circuit included in the data channel circuit 410 may include the receive equalization circuit and the transmit equalization circuit.

Optionally, in some other embodiments, the equalization circuit included in the data channel circuit 410 may include the receive equalization circuit and the DFE circuit.

Optionally, in some other embodiments, the equalization circuit included in the data channel circuit 410 may include the transmit equalization circuit and the DFE circuit.

Optionally, in some other embodiments, the equalization circuit included in the data channel circuit 410 may include the receive equalization circuit, the DFE circuit, and the transmit equalization circuit.

If the data channel circuit 410 includes only the receive equalization circuit, a signal obtained by the CDR circuit in the data channel circuit 410 is a signal on which the receive equalization circuit performs equalization processing. A signal obtained by the receive equalization circuit is a signal from a communications device connected to the retimer 400. The CDR circuit outputs a signal on which clock and data recovery processing is performed to an output buffer, and the output buffer outputs the signal on which clock and data recovery processing is performed to another communications device connected to the retimer 400.

If the data channel circuit 410 includes only the transmit equalization circuit, a signal obtained by the CDR circuit in the data channel circuit 410 is a signal from a communications device. The CDR circuit outputs a signal on which clock and data recovery processing is performed to the transmit equalization circuit. The transmit equalization circuit performs equalization processing on the obtained signal, and then outputs a signal on which equalization processing is performed to an output buffer. The output buffer outputs the signal on which equalization processing is performed to another communications device connected to the retimer 400.

If the data channel circuit 410 includes both the receive equalization circuit and the transmit equalization circuit, a signal obtained by the CDR circuit in the data channel circuit 410 is a signal on which the receive equalization circuit performs equalization processing. A signal obtained by the receive equalization circuit is a signal from a communications device connected to the retimer 400. The CDR circuit outputs a signal on which clock and data recovery processing is performed to the transmit equalization circuit. The transmit equalization circuit performs equalization processing on the obtained signal, and then outputs a signal on which equalization processing is performed to an output buffer. The output buffer outputs the signal on which equalization processing is performed to another communications device connected to the retimer 400.

If the data channel circuit 410 includes both the receive equalization circuit and the DFE circuit, a signal obtained by the CDR circuit in the data channel circuit 410 is a signal on which the DFE circuit performs equalization processing. A signal received by the DFE circuit is a signal processed by the receive equalization circuit. A signal obtained by the receive equalization circuit is a signal from a communications device connected to the retimer 400. The CDR circuit outputs a signal on which clock and data recovery processing is performed to an output buffer, and the output buffer outputs the signal on which equalization processing is performed to another communications device connected to the retimer 400.

If the data channel circuit 410 includes both the transmit equalization circuit and the DFE circuit, a signal obtained by the CDR circuit in the data channel circuit 410 is a signal on which the DFE circuit performs equalization processing. A signal received by the DFE circuit is a signal from a communications device connected to the retimer 400. The CDR circuit outputs a signal on which clock and data recovery processing is performed to the transmit equalization circuit. The transmit equalization circuit performs equalization processing on the obtained signal, and then outputs a signal on which equalization processing is performed to an output buffer. The output buffer outputs the signal on which equalization processing is performed to another communications device connected to the retimer 400.

If the data channel circuit 410 includes all of the receive equalization circuit, the transmit equalization circuit, and the DFE circuit, a signal obtained by the CDR circuit in the data channel circuit 410 is a signal on which the DFE circuit performs equalization processing. A signal obtained by the DFE circuit is a signal on which the receive equalization circuit performs equalization processing. A signal obtained by the receive equalization circuit is a signal from a communications device connected to the retimer 400. The CDR circuit outputs a signal on which clock and data recovery processing is performed to the transmit equalization circuit. The transmit equalization circuit performs equalization processing on the obtained signal, and then outputs a signal on which equalization processing is performed to an output buffer. The output buffer outputs the signal on which equalization processing is performed to another communications device connected to the retimer 400.

The equalization processing-based transparent transmission of a signal between the first communications device and the second communications device means that a signal from the first communications device may be transparently transmitted to the second communications device, and a signal from the second communications device may be transparently transmitted to the first communications device.

The "equalization processing-based transparent transmission" (which is also referred to as "transparent transmission" below for short) in this application is transparent transmission in which only equalization processing is performed on a signal. In other words, other processing than equalization processing that changes a format or content of a signal is not performed. For example, processing such as serial-to-parallel conversion, coding, or decoding is not performed. Certainly, a person skilled in the art may understand that a transparent transmission process may also include some basic processing used to complete transmission, for example, processing such as storage or clock providing. However, the processing does not change a format or content of a signal, and therefore does not affect "transparent transmission". To be specific, the data channel circuit 410 shown in FIG. 4 performs only equalization processing on a signal. However, in the retimer 300 shown in FIG. 3, the receive equalization circuit and the transmit equalization circuit further perform serial-to-parallel conversion, coding, decoding, and the like on a signal in addition to performing equalization processing on the signal. Therefore, the retimer 300 does not implement transparent transmission of a signal between the first communications device and the second communications device. In other words, the retimer 300 does not transparently transmit a first signal from the first communications device to the second communications device, and does not transparently transmit a second signal from the second communications device to the first communications device either.

The link adjustment circuit 420 is configured to obtain a signal transmitted in the data channel circuit 410.

The link adjustment circuit 420 may be connected to the data channel circuit 410 by using a bus, and obtain, by using the bus, the signal transmitted in the data channel circuit 410. The data channel circuit 410, the link adjustment circuit 420, the phase locked loop 431, and the phase locked loop 432 may be connected to each other through a management channel, to transmit a control signal through the management channel, and implement operations such as phase locked loop configuration and equalization control.

The signal transmitted in the data channel circuit 410 may be a negotiation signal used for negotiation, or may be a data signal used for data transmission. Unless otherwise specified, in this embodiment of this application, the signal transmitted in the data channel circuit 410 may be a data signal or a negotiation signal.

The link adjustment circuit 420 is further configured to obtain link status information based on the obtained signal.

The link adjustment circuit 420 is further configured to: when determining, based on the link status information, that a rate of a link needs to be changed, configure an operating parameter of a target phase locked loop as an operating parameter corresponding to a changed rate. The target phase locked loop is an unused phase locked loop in at least two phase locked loops. To be specific, the link adjustment circuit may configure a phase locked loop in advance for subsequent use when a rate needs to be changed.

The link adjustment circuit 420 is further configured to switch a currently used phase locked loop to the target phase locked loop when detecting that the link enters a rate-changing state.

The data channel circuit 410 is further configured to implement, under a function of the target phase locked loop, equalization processing-based transparent transmission of a signal between the first communications device and the second communications device.

Both the retimer 300 shown in FIG. 3 and the retimer 400 shown in FIG. 4 may be applied to the system 100 shown in FIG. 1 and the system 200 shown in FIG. 2. When the retimer 300 shown in FIG. 3 is applied to the system 100 or the system 200, the retimer 300 does not perform only equalization processing-based transparent transmission a signal, that is, the retimer 300 needs to perform a series of operations on a received signal, such as serial-to-parallel conversion, coding, decoding, and buffering. All these operations may increase a signal transmission delay. Compared with the retimer 300 shown in FIG. 3, when a signal is transmitted in the retimer 400 in this application, the retimer 400 transparently transmits the signal. In a process in which the signal is transmitted in the retimer 400, a series of operations such as serial-to-parallel conversion, coding/decoding, and buffering do not need to be performed on the signal. Therefore, compared with the retimer 300 shown in FIG. 3, a time for transmitting a signal in the retimer 400 should be less than a time for transmitting a signal in the retimer 300. In conclusion, the retimer 400 shown in FIG. 4 can reduce a signal transmission delay.

In addition, the retimer 400 shown in FIG. 4 includes a plurality of phase locked loops. When determining that the rate of the link needs to be changed, the link adjustment circuit may configure the operating parameter of the target phase locked loop as the operating parameter corresponding to the changed rate. In other words, when the link adjustment circuit configures the operating parameter of the target phase locked loop as the operating parameter corresponding to the changed rate, the rate of the link only needs to be changed and has not been changed. To be specific, the retimer 400 includes the plurality of phase locked loops, and therefore the link adjustment circuit may configure, in advance, an operating parameter of the phase locked loop that does not operate, and switch the currently used phase locked loop to the unused phase locked loop when the unused phase locked loop is required to operate with the operating parameter.

When the retimer 400 shown in FIG. 4 is applied to the system shown in FIG. 1 or FIG. 2, the retimer 400 may transmit the first signal from the first communications device to the second communications device in a transparent transmission manner (which is also referred to as "transparently transmitted to" below for short), and transmit the second signal from the second communications device to the first communications device in the transparent transmission manner.

Optionally, in some embodiments, the link adjustment circuit may directly adjust the operating parameter of the phase locked loop that currently operates, so that the operating parameter of the phase locked loop that currently operates meets the operating parameter corresponding to the changed rate. However, in some cases, a time for adjusting the operating parameter of the phase locked loop that currently operates may exceed a shortest time specified by a protocol. Therefore, a phase locked loop is directly configured in advance, and the phase locked loop that currently operates is directly switched to the configured phase locked loop when a rate is changed, so that a phase locked loop that meets a rate requirement may be used for operation during the time specified by the protocol.

FIG. 4 shows the retimer including two phase locked loops. It may be understood that in some embodiments, the retimer shown in FIG. 4 may include more than two phase locked loops. An operating manner of the retimer including more than two phase locked loops is the same as an operating manner of the retimer including two phase locked loops shown in FIG. 4, and details are not described herein again.

In some other embodiments, the retimer shown in FIG. 4 may include more than one phase locked loop. In this case, the link adjustment circuit is further configured to: when determining, based on the link status information, that a rate of a link needs to be changed, configure an operating parameter of a phase locked loop in the retimer as an operating parameter corresponding to a changed rate. The link adjustment circuit is further configured to: when detecting that the link enters a rate-changing state, switch the operating parameter of the phase locked loop to the operating parameter corresponding to the changed rate.

The data channel circuit 410 may include at least one group of sub-data channel circuits, and each group of sub-data channel circuits includes one first sub-data channel circuit and one second sub-data channel circuit. The first sub-data channel circuit is configured to receive the first signal from the first communications device, and transparently transmit the first signal to the second communications device. The second sub-data channel circuit is configured to receive the second signal from the second communications device, and transparently transmit the second signal to the first communications device.

A difference between the first sub-data channel circuit and the second sub-data channel circuit merely lies in that source communications devices and destination communications devices of received signals are different. Therefore, the data channel circuit is described below by using only a first sub-data channel circuit 411 as an example. The first sub-data channel circuit 411 may be any first sub-data channel circuit in the data channel circuit 410. Both a structure and a function of any second sub-data channel circuit in the data channel circuit 410 are the same as a structure and a function of the first sub-data channel circuit 411.

Figure 5:
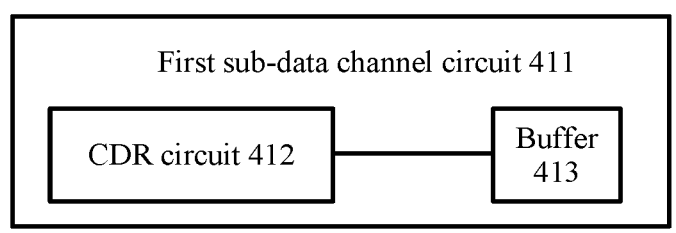
FIG. 5 is a structural block diagram of a first sub-data channel circuit 411 according to an embodiment of this application.

FIG. 5 is a structural block diagram of a first sub-data channel circuit 411 according to an embodiment of this application. As shown in FIG. 5, the first sub-data channel circuit 411 includes a CDR circuit 412 and an output buffer 413.

The CDR circuit 412 is configured to extract time sequence information such as a clock from an obtained signal, and retime the signal by using the extracted time sequence information, to eliminate jitters of the signal that are accumulated in a transmission process.

The output buffer 413 is configured to output the signal to a physical link.

When the first sub-data channel circuit does not include an equalization circuit, a signal from a communications device sequentially passes through the CDR circuit 412 and the output buffer 413.

Optionally, in some embodiments, the output buffer 413 may be an OD circuit, a circuit with a general current mode logic level structure, or the like.

Optionally, in some embodiments, the first sub-data channel circuit 411 may further include an equalization circuit to further improve an equalization effect. The equalization circuit may include at least one of a receive equalization circuit, a transmit equalization circuit, or a DFE circuit.

The receive equalization circuit may be a CTLE. The receive equalization circuit may reduce a component of a low frequency signal, enlarge a component around a Nyquist frequency, and filter out a relatively high frequency, to improve quality of a received signal.

The transmit equalization circuit is configured to compensate for signal distortion that is caused by a channel loss when a signal is transmitted on a physical channel. This may be usually implemented by using a feed forward equalization (FEE) technology.

The DFE circuit is configured to reduce or even eliminate signal distortion that is caused by interference and discontinuous impedance when a signal is transmitted on a physical channel.

When the first sub-data channel circuit includes the receive equalization circuit, a signal from a communications device sequentially passes through the receive equalization circuit, the CDR circuit 412, and the output buffer 413.

When the first sub-data channel circuit includes the transmit equalization circuit, a signal from a communications device sequentially passes through the CDR circuit 412, the transmit equalization circuit, and the output buffer 413.

When the first sub-data channel circuit includes the receive equalization circuit and the transmit equalization circuit, a signal from a communications device sequentially passes through the receive equalization circuit, the CDR circuit 412, the transmit equalization circuit, and the output buffer 413.

When the first sub-data channel circuit includes the receive equalization circuit and the DFE circuit, a signal from a communications device sequentially passes through the receive equalization circuit, the DFE circuit, the CDR circuit 412, and the output buffer 413.

When the first sub-data channel circuit includes the transmit equalization circuit and the DFE circuit, a signal from a communications device sequentially passes through the DFE circuit, the CDR circuit 412, the transmit equalization circuit, and the output buffer 413.

When the first sub-data channel circuit includes the receive equalization circuit, the transmit equalization circuit, and the DFE circuit, a signal from a communications device sequentially passes through the receive equalization circuit, the DFE circuit, the CDR circuit 412, the transmit equalization circuit, and the output buffer 413.

The link adjustment circuit 420 may obtain link state information based on the obtained signal.

A PCIe protocol is used as an example, and 11 states are specified in the PCIe protocol. A link is switched between the 11 states. For the 11 states and a switching relationship, refer to regulations in the PCIe protocol (for example, the version 1.0 of the PCIe base specification revision 4.0). Details are not described herein. The link status information may include a state, of the link, that is specified by the PCIe protocol. The link adjustment circuit 420 obtains the state of the link by parsing the obtained signal, and determines, based on the state, whether a rate of the link needs to be changed.

For specific methods in which the link adjustment circuit 420 determines the state of the link, whether the rate of the link needs to be changed, whether the link enters a rate-changing state, whether the link is in an equalized state, refer to regulations in a protocol. For example, if the retimer 400 is a retimer used for PCIe protocol-based transmission, for the specific methods, refer to regulations in the PCIe protocol (for example, the version 1.0 of the PCIe base specification revision 4.0). Details are not described herein.

A frequency of a phase locked loop may be multiplied to a frequency of an operating rate based on an externally input clock, and the frequency is provided for the CDR circuit for phase adjustment, so as to quickly lock a signal. The CDR circuit uses and sends data based on a clock frequency determined by an operating parameter of the phase locked loop.

An operating parameter configured by the link adjustment circuit 420 for a target phase locked loop is a parameter that is required to multiply a frequency of the phase locked loop to the frequency of the operating rate, for example, a phase locked loop bandwidth, a frequency multiplication multiplier, or a frequency division coefficient.

Optionally, in some embodiments, the link adjustment circuit 420 is further configured to perform equalization adjustment when determining, based on the link status information, that the link is in the equalized state. A bit error occurring when a signal is transmitted normally may be avoided by performing equalization adjustment.

The link adjustment circuit is specifically configured to perform equalization adjustment on an equalization circuit when determining, based on the link status information, that the link is in the equalized state. The equalization circuit may include at least one of a receive equalization circuit, a transmit equalization circuit, or a decision feedback equalization circuit.

Optionally, in some embodiments, the link adjustment circuit is specifically configured to perform equalization adjustment on the receive equalization circuit when determining, based on the link status information, that the link is in the equalized state. The receive equalization circuit can operate with a proper operating parameter after the receive equalization circuit is adjusted, so as to reduce a component of a low frequency signal, enlarge a component around a Nyquist frequency, and filter out a relatively high frequency, thereby improving quality of a received signal.

Optionally, in some embodiments, the link adjustment circuit is specifically configured to adjust the transmit equalization circuit when determining, based on the link status information, that the link is in the equalized state. The transmit equalization circuit can operate with a proper operating parameter after the transmit equalization circuit is adjusted, so as to compensate for signal distortion that is caused by a channel loss when a signal is transmitted on a physical channel.

Optionally, in some embodiments, the link adjustment circuit is specifically configured to adjust the decision feedback equalization circuit when determining, based on the link status information, that the link is in the equalized state. The decision feedback equalization circuit can operate with a proper operating parameter after the DFE circuit is adjusted, so as to reduce or even eliminate signal distortion that is caused by interference and discontinuous impedance when a signal is transmitted on a physical channel.

Optionally, in some embodiments, the link adjustment circuit 420 is further configured to determine a target equalization parameter value when detecting that the link enters the rate-changing state. The target equalization parameter value is an equalization parameter value corresponding to the changed rate, and the equalization parameter value is positively correlated with the changed rate. In other words, the equalization parameter value increases with an increase of the rate.

Optionally, in some embodiments, the link adjustment circuit 420 is further configured to configure the data channel circuit 410 when detecting that the first communications device is connected to the retimer and the second communications device is connected to the retimer, so that a first negotiation signal from the first communications device can be transparently transmitted to the second communications device, a second negotiation signal from the second communications device can be transparently transmitted to the first communications device, and the first communications device and the second communications device complete a negotiation procedure by using the first negotiation signal and the second negotiation signal. In this way, when the retimer 400 shown in FIG. 4 is applied to the system shown in FIG. 1 or FIG. 2, the first communications device may directly negotiate with the second communications device. Therefore, a relay that is caused when the retimer 400 needs to negotiate with the first communications device and the second communications device may be avoided.

Optionally, in some embodiments, the link adjustment circuit 410 may configure an input resistance at a data interface as 50 ohms to ground to configure the data channel circuit 420, so that the first negotiation signal from the first communications device can be transparently transmitted to the second communications device, and the second negotiation signal from the second communications device can be transparently transmitted to the first communications device.

A person skilled in the art may understand that functions of the retimer 400 shown in FIG. 4 may also be implemented in another manner. For example, the retimer 400 shown in FIG. 4 is merely an example. In actual implementation, a person skilled in the art may set a circuit according to an actual requirement to implement the functions of the retimer 400 shown in FIG. 4, but it should not be considered that the implementation goes beyond the scope of this application. For example, the circuits in the retimer 400 shown in FIG. 4 may be integrated into one circuit, or each of the circuits may exist alone physically, or two or more circuits are integrated into one circuit.

For example, the link adjustment circuit 420 shown in FIG. 4 includes a link status circuit and a phase locked loop control circuit. The link status circuit is configured to obtain a signal transmitted in a data channel circuit. The link status circuit is further configured to obtain link status information based on the obtained signal. The link status circuit is further configured to determine, based on the link status information, that a rate of a link needs to be changed. The Phase locked loop control circuit is configured to: when the link status circuit determines that the rate of the link needs to be changed, configure an operating parameter of a target phase locked loop as an operating parameter corresponding to a changed rate. The target phase locked loop is an unused phase locked loop in at least two phase locked loops. The link status circuit is further configured to detect that the link enters a rate-changing state. The Phase locked loop control circuit is further configured to switch a currently used phase locked loop to the target phase locked loop when the link status circuit detects that the link enters the rate-changing state.

Optionally, in some embodiments, the link adjustment circuit 420 may further include a link equalization control circuit. The link status circuit is configured to determine, based on the link status information, that the link is in an equalized state. The link equalization control circuit is configured to perform equalization adjustment when the link status circuit determines that the link is in the equalized state.

Optionally, in some embodiments, the link equalization control circuit is further configured to determine a target equalization parameter value when the link status circuit detects that the link enters the rate-changing state. The target equalization parameter value is an equalization parameter value corresponding to the changed rate, and the target equalization parameter value is positively correlated with the changed rate.

Optionally, in some embodiments, the link status circuit is further configured to configure the data channel circuit when detecting that a first communications device is connected to a data channel circuit and a second communications device is connected to the data channel circuit, so that a first negotiation signal from the first communications device can be transparently transmitted to the second communications device, a second negotiation signal from the second communications device can be transparently transmitted to the first communications device, and the first communications device and the second communications device complete a negotiation procedure by using the first negotiation signal and the second negotiation signal.

The link status circuit may be connected to the data channel circuit by using a bus, and is connected to the phase locked loop control circuit and another related circuit through a management channel. The phase locked loop control circuit, the link equalization control circuit, and the like may be connected to each other through the management channel.

Figure 6:
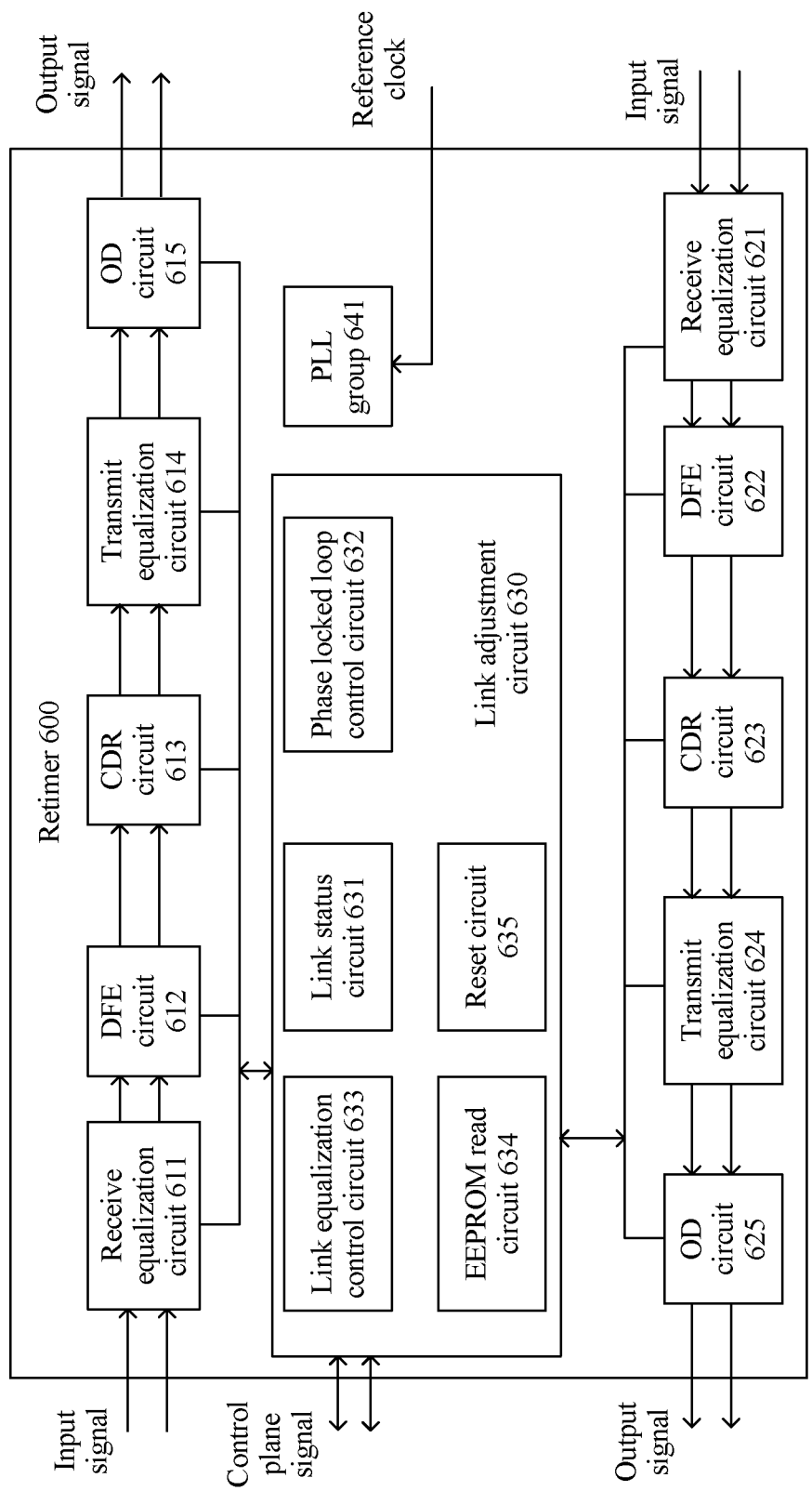
FIG. 6 is a structural block diagram of a retimer for link equalization according to an embodiment of this application.

FIG. 6 is a structural block diagram of another retimer according to an embodiment of this application. A retimer 600 shown in FIG. 6 includes a receive equalization circuit 611, a DFE circuit 612, a CDR circuit 613, a transmit equalization circuit 614, an OD circuit 615, a receive equalization circuit 621, a DFE circuit 622, a CDR circuit 623, a transmit equalization circuit 624, and an OD circuit 625. The retimer 600 further includes a link adjustment circuit 630. The link adjustment circuit 630 includes a link status circuit 631, a phase locked loop control circuit 632, a link equalization control circuit 633, an electrically erasable programmable read-only memory (EEPROM) read circuit 634, and a reset circuit 635. The retimer 600 further includes a PLL group 641, and the PLL group 641 includes at least two PLLs.

The retimer 600 shown in FIG. 6 may be the retimer in the system shown in FIG. 1, or may be the retimer in the system shown in FIG. 2. The three retimers in the system shown in FIG. 2 each may be the retimer 600 shown in FIG. 6.

The system 100 shown in FIG. 1 is used as an example. The first communications device 110 may be connected to the retimer 600 through a first data input interface and a first data output interface. The second communications device 120 may be connected to the retimer 600 through a second data input interface and a second data output interface.

The first communications device 110 sends a signal to the retimer 600 through the first data input interface. The signal sent by the first communications device 110 sequentially passes through the receive equalization circuit 611, the DFE circuit 612, the CDR circuit 613, and the transmit equalization circuit 614. Then the OD circuit 615 sends the signal from the first communications device 110 to the second communications device 120 through the second data output interface.

The second communications device 120 sends a signal to the retimer 600 through the second data input interface. The signal sent by the second communications device 120 sequentially passes through the receive equalization circuit 621, the DFE circuit 622, the CDR circuit 623, and the transmit equalization circuit 624. Then the OD circuit 625 sends the signal from the second communications device 110 to the first communications device 110 through the first data output interface.

It may be learned that the receive equalization circuit 611, the DFE circuit 612, the CDR circuit 613, the transmit equalization circuit 614, and the OD circuit 615 may form a first sub-data channel circuit in a group of sub-data channel circuits. The receive equalization circuit 621, the DFE circuit 622, the CDR circuit 623, the transmit equalization circuit 624, and the OD circuit 625 may form a second sub-data channel circuit in a group of sub-data channel circuits.

The retimer 600 in FIG. 6 merely shows a group of sub-data channels included in a data channel circuit. A person skilled in the art may understand that a plurality of groups of sub-data channels included in the data channel circuit each are similar to the group of sub-data channels shown in FIG. 6. Details are not described herein again.

For specific functions and beneficial effects of the receive equalization circuit 611, the DFE circuit 612, the CDR circuit 613, the transmit equalization circuit 614, the OD circuit 615, the receive equalization circuit 621, the DFE circuit 622, the CDR circuit 623, the transmit equalization circuit 624, and the OD circuit 625, refer to the embodiment shown in FIG. 4 or FIG. 5. Details are not described herein again.

For specific functions and beneficial effects of the link status circuit 631, the phase locked loop control circuit 632, and the link equalization control circuit 633 that are included in the link adjustment circuit 630, refer to the embodiment shown in FIG. 4 or FIG. 5. Details are not described herein again. The EEPROM read circuit 634 is configured to store an initial configuration parameter, for example, an equalization parameterization configuration parameter or an initial phase locked loop configuration. The reset circuit 635 is configured to reset a link when the link is faulty.

A control plane signal is a signal accessed by a communications device connected to the retimer 600. For example, the communications device may initiate resetting by using the control plane signal, read data in an EEPROM, and read an equalization circuit configuration parameter.

A frequency of a PLL that currently operates in the PLL group 641 is multiplied to a frequency of an operating rate based on an externally input reference clock, and the frequency is provided for the CDR circuit 613 and the CDR circuit 623 for phase adjustment, so as to quickly lock a signal.

Figure 7:
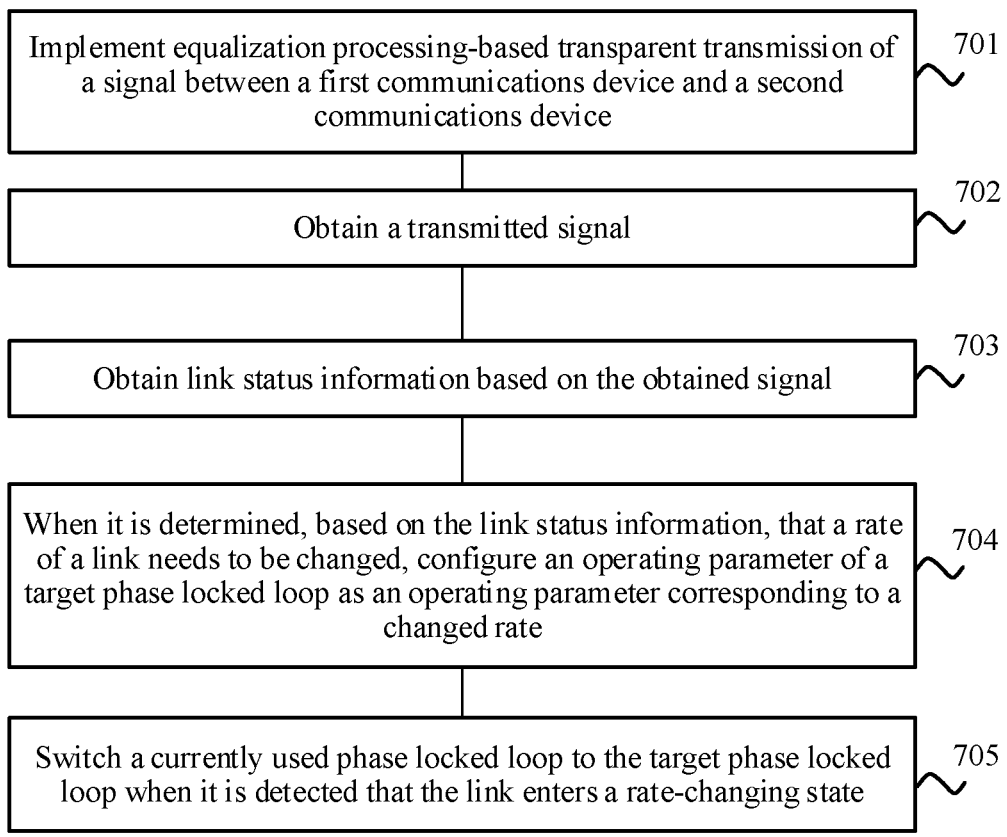
FIG. 7 is a schematic flowchart of a signal transmission method according to an embodiment of this application.

FIG. 7 is a schematic flowchart of a signal transmission method according to an embodiment of this application. The method shown in FIG. 7 may be performed by a retimer for link equalization.

701. Implement equalization processing-based transparent transmission of a signal between a first communications device and a second communications device.

702. Obtain a transmitted signal.

703. Obtain link status information based on the obtained signal.

704. When it is determined, based on the link status information, that a rate of a link needs to be changed, configure an operating parameter of a target phase locked loop as an operating parameter corresponding to a changed rate, where the target phase locked loop is an unused phase locked loop in at least two phase locked loops.

705. Switch a currently used phase locked loop to the target phase locked loop when it is detected that the link enters a rate-changing state.

Optionally, in some embodiments, the method further includes: performing equalization adjustment when it is determined, based on the link status information, that the link is in an equalized state.

Optionally, in some embodiments, the method further includes: determining a target equalization parameter value when it is detected that the link enters the rate-changing state, where the target equalization parameter value is an equalization parameter value corresponding to the changed rate, and the target equalization parameter value is positively correlated with the changed rate.

Optionally, in some embodiments, the method further includes: configuring the retimer when it is detected that the first communications device is connected to the retimer and the second communications device is connected to the retimer, so that a first negotiation signal from the first communications device can be transparently transmitted to the second communications device, a second negotiation signal from the second communications device can be transparently transmitted to the first communications device, and the first communications device and the second communications device complete a negotiation procedure by using the first negotiation signal and the second negotiation signal.

Figure 8:
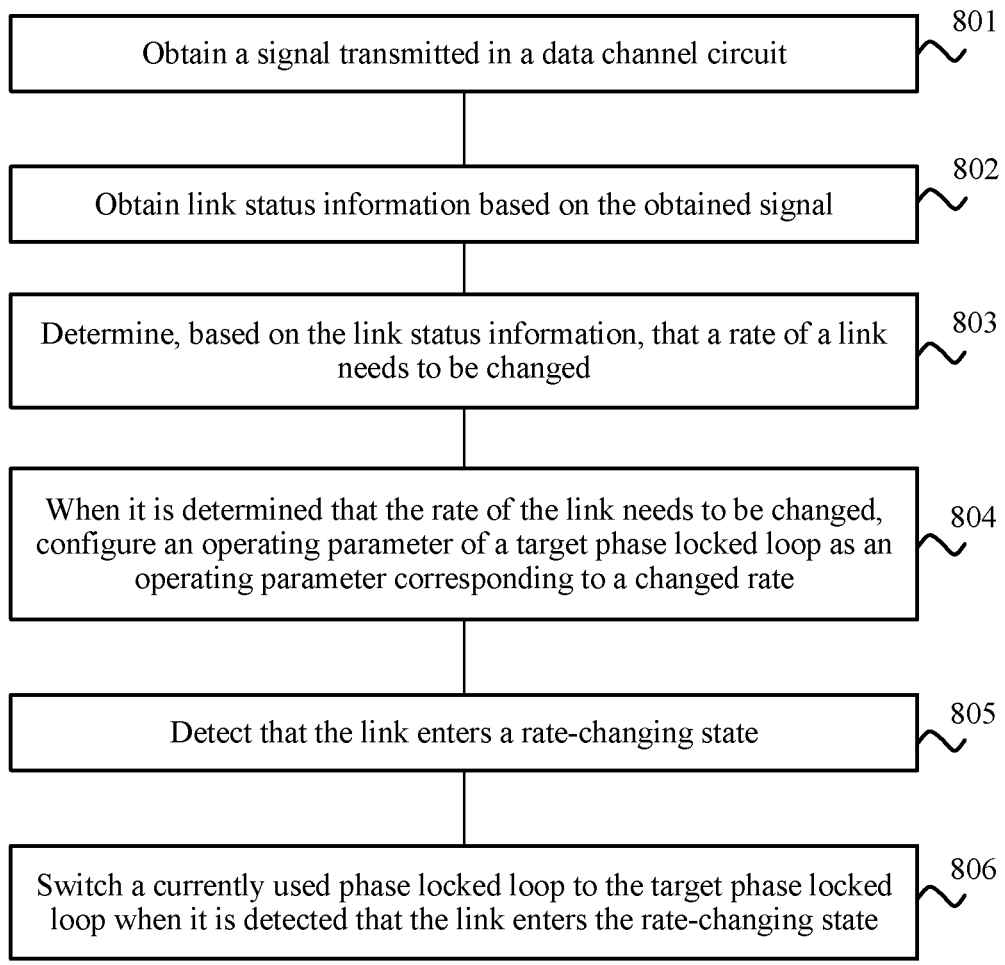
FIG. 8 is a schematic flowchart of a signal transmission method according to an embodiment of this application.

FIG. 8 is a schematic flowchart of a signal transmission method according to an embodiment of this application. The method shown in FIG. 8 may be performed by a link adjustment circuit.

801. Obtain a signal transmitted in a data channel circuit.

802. Obtain link status information based on the obtained signal.

803. Determine, based on the link status information, that a rate of a link needs to be changed.

804. When it is determined that the rate of the link needs to be changed, configure an operating parameter of a target phase locked loop as an operating parameter corresponding to a changed rate, where the target phase locked loop is an unused phase locked loop in at least two phase locked loops.

805. Detect that the link enters a rate-changing state.

806. Switch a currently used phase locked loop to the target phase locked loop when it is detected that the link enters the rate-changing state.

Optionally, in some embodiments, the method further includes: determining, based on the link status information, that the link is in an equalized state; and performing equalization adjustment when it is determined that the link is in the equalized state.

Optionally, in some embodiments, the method further includes: determining a target equalization parameter value when it is detected that the link enters the rate-changing state, where the target equalization parameter value is an equalization parameter value corresponding to the changed rate, and the target equalization parameter value is positively correlated with the changed rate.

Optionally, in some embodiments, the method further includes: configuring the data channel circuit when it is detected that a first communications device is connected to the data channel circuit and a second communications device is connected to the data channel circuit, so that a first negotiation signal from the first communications device can be transparently transmitted to the second communications device, a second negotiation signal from the second communications device can be transparently transmitted to the first communications device, and the first communications device and the second communications device complete a negotiation procedure by using the first negotiation signal and the second negotiation signal.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a specific operating process or implementation of the foregoing system and method, refer to a corresponding process in the foregoing apparatus embodiments. Details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a USB flash retimer, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A retimer for link equalization, comprising:
    a data channel circuit configured to implement, under a function of a current phase locked loop, equalization processing-based transparent transmission of a signal between a first communications device and a second communications device;
    a link adjustment circuit configured to:
        obtain the signal transmitted in the data channel circuit;
        obtain link status information based on the obtained signal;
        in response to determining, based on the link status information, that a rate of a link needs to be changed, configure in advance an operating parameter of a target phase locked loop as an operating parameter corresponding to a changed rate, wherein the target phase locked loop is an unused phase locked loop in at least two phase locked loops; and
        switch the current phase locked loop to the target phase locked loop in response to detecting that the link enters a rate-changing state,
    wherein the data channel circuit is further configured to implement, under a function of the target phase locked loop, the equalization processing-based transparent transmission of the signal between the first communications device and the second communications device,
    wherein the link adjustment circuit is further configured to:
        perform equalization adjustment in response to determining, based on the link status information, that the link is in an equalized state, and
        determine a target equalization parameter value in response to detecting that the link enters the rate-changing state, wherein the target equalization parameter value is an equalization parameter value corresponding to the changed rate, and the target equalization parameter value is correlated with the changed rate.

2. The retimer according to claim 1, wherein the data channel circuit comprises a clock and data recovery circuit, an output buffer, and an equalization circuit; and
    the link adjustment circuit is configured to perform equalization adjustment on the equalization circuit in response to determining, based on the link status information, that the link is in the equalized state.

3. The retimer according to claim 1, wherein the correlated with the changed rate is a positive correlation.

4. The retimer according to claim 1, wherein the link adjustment circuit is further configured to configure the data channel circuit in response to detecting that the first communications device is connected to the retimer and the second communications device is connected to the retimer, so that the following situations (a), (b) and (c) occur:
    (a) a first negotiation signal from the first communications device can be transmitted to the second communications device in a transparent transmission manner,
    (b) a second negotiation signal from the second communications device can be transmitted to the first communications device in the transparent transmission manner, and
    (c) the first communications device and the second communications device complete a negotiation procedure by using the first negotiation signal and the second negotiation signal.

5. The retimer according to claim 1, wherein the link adjustment circuit comprises a link status circuit and a phase locked loop control circuit, wherein:
    the link status circuit is configured to obtain a signal transmitted in the data channel circuit; obtain link status information based on the obtained signal; determine, based on the link status information, that a rate of a link needs to be changed;
    the phase locked loop control circuit is configured to: in response to the link status circuit determining that the rate of the link needs to be changed, configure an operating parameter of a target phase locked loop as an operating parameter corresponding to a changed rate, wherein the target phase locked loop is an unused phase locked loop in the at least two phase locked loops;
    the link status circuit is further configured to detect that the link enters a rate-changing state; and
    the phase locked loop control circuit is further configured to switch a currently used phase locked loop to the target phase locked loop in response to the link status circuit detecting that the link enters the rate-changing state.

6. The retimer according to claim 5, wherein the link adjustment circuit further comprises a link equalization control circuit;
    the link status circuit is further configured to determine, based on the link status information, that the link is in an equalized state; and
    the link equalization control circuit is configured to control the link to perform equalization adjustment in response to the link status circuit determining that the link is in the equalized state.

7. The retimer according to claim 6, wherein the link equalization control circuit is further configured to determine a target equalization parameter value in response to the link status circuit detecting that the link enters the rate-changing state, wherein the target equalization parameter value is an equalization parameter value corresponding to the changed rate, and the target equalization parameter value is positively correlated with the changed rate.

8. The retimer according to claim 5, wherein the link status circuit is further configured to configure the data channel circuit in response to detecting that the first communications device is connected to the data channel circuit and the second communications device is connected to the data channel circuit, so that the following situations (a), (b) and (c) occur:

(a) a first negotiation signal from the first communications device can be transmitted to the second communications device in the transparent transmission manner, (b) a second negotiation signal from the second communications device can be transmitted to the first communications device in a transparent transmission manner, and (c) the first communications device and the second communications device complete a negotiation procedure by using the first negotiation signal and the second negotiation signal.

9. A signal transmission method, wherein the method is performed by a retimer for link equalization, and the method comprises:

implementing, by a data channel circuit of the retimer, equalization processing-based transparent transmission of a signal between a first communications device and a second communications device;

obtaining, by a link adjustment circuit of the retimer, the transmitted signal;

obtaining, by the link adjustment circuit of the retimer, link status information based on the obtained signal;

in response to determining, based on the link status information, that a rate of a link needs to be changed, configuring in advance, by the link adjustment circuit of the retimer, an operating parameter of a target phase locked loop as an operating parameter corresponding to a changed rate, wherein the target phase locked loop is an unused phase locked loop in at least two phase locked loops;

switching, by the link adjustment circuit of the retimer, a currently used phase locked loop to the target phase locked loop in response to detecting that the link enters a rate-changing state; and implementing, by the data channel circuit of the retimer, under a function of the target phase locked loop, the equalization processing-based transparent transmission of the signal between the first communications device and the second communications device, wherein the method further comprises:
performing, by the link adjustment circuit, equalization adjustment in response to determining, based on the link status information, that the link is in an equalized state, and determining, by the link adjustment circuit of the retimer, a target equalization parameter value in response to detecting that the link enters the rate-changing state, wherein the target equalization parameter value is an equalization parameter value corresponding to the changed rate, and the target equalization parameter value is correlated with the changed rate.

10. The method according to claim 9, wherein the correlated with the changed rate is a positive correlation.

11. The method according to claim 9, wherein the method further comprises: configuring, by the link adjustment circuit of the retimer, the data channel circuit of the retimer in response to detecting that the first communications device is connected to the retimer and the second communications device is connected to the retimer, so that the following situations (a), (b) and (c) occur:

(a) a first negotiation signal from the first communications device can be transmitted to the second communications device in the transparent transmission manner, (b) a second negotiation signal from the second communications device can be transmitted to the first communications device in a transparent transmission manner, and (c) the first communications device and the second communications device complete a negotiation procedure by using the first negotiation signal and the second negotiation signal.

12. A signal transmission system, wherein the system comprises a first communications device, a second communications device, and at least one retimer for link equalization, wherein:

the first communications device is configured to send a first signal to the at least one retimer;

the at least one retimer is configured to transmit the first signal to the second communications device in a transparent transmission manner;

the second communications device is configured to send a second signal to the at least one retimer; and the at least one retimer is further configured to transmit the second signal to the first communications device in the transparent transmission manner; and the at least one retimer comprises a data channel circuit, a link adjustment circuit, and at least two phase locked loops, wherein:

the data channel circuit is configured to implement, under a function of a current phase locked loop, equalization processing-based transparent transmission of a signal between the first communications device and the second communications device;

the link adjustment circuit is configured to:
obtain the signal transmitted in the data channel circuit;

obtain link status information based on the obtained signal;

in response to determining, based on the link status information, that a rate of a link needs to be changed, configure in advance an operating parameter of a target phase locked loop as an operating parameter corresponding to a changed rate, wherein the target phase locked loop is an unused phase locked loop in the at least two phase locked loops;

switch the current phase locked loop to the target phase locked loop when detecting that the link enters a rate-changing state; and the data channel circuit is further configured to implement, under a function of the target phase locked loop, the equalization processing-based transparent transmission of the signal between the first communications device and the second communications device, wherein the link adjustment circuit of the retimer is further configured to perform equalization adjustment in response to determining, based on the link status information, that the link is in an equalized state, and wherein the link adjustment circuit of the retimer is further configured to determine a target equalization parameter value in response to detecting that the link enters the rate-changing state, wherein the target equalization parameter value is an equalization parameter value corresponding to the changed rate, and the target equalization parameter value is correlated with the changed rate.

13. The signal transmission system according to claim 12, wherein the data channel circuit of the retimer comprises a clock and data recovery circuit, an output buffer, and an equalization circuit; and the link adjustment circuit of the retimer is configured to perform equalization adjustment on the equalization circuit in response to determining, based on the link status information, that the link is in the equalized state.

14. The signal transmission system according to claim 12, wherein the correlated with the changed rate is a positive correlation.

15. The signal transmission system according to claim 12, wherein the link adjustment circuit of the retimer is further configured to configure the data channel circuit in response to detecting that the first communications device is connected to the retimer and the second communications device is connected to the retimer, so that the following situations (a), (b) and (c) occur:
  (a) a first negotiation signal from the first communications device can be transmitted to the second communications device in a transparent transmission manner,
  (b) a second negotiation signal from the second communications device can be transmitted to the first communications device in the transparent transmission manner, and
  (c) the first communications device and the second communications device complete a negotiation procedure by using the first negotiation signal and the second negotiation signal.

16. The signal transmission system according to claim 12, wherein the link adjustment circuit of the retimer comprises a link status circuit and a phase locked loop control circuit, wherein:

the link status circuit is configured to obtain a signal transmitted in the data channel circuit; obtain link status information based on the obtained signal; determine, based on the link status information, that a rate of a link needs to be changed; and the phase locked loop control circuit is configured to: in response to the link status circuit determining that the rate of the link needs to be changed, configure an operating parameter of a target phase locked loop as an operating parameter corresponding to a changed rate, wherein the target phase locked loop is an unused phase locked loop in the at least two phase locked loops;

the link status circuit is further configured to detect that the link enters a rate-changing state; and the phase locked loop control circuit is further configured to switch a currently used phase locked loop to the target phase locked loop in response to the link status circuit detecting that the link enters the rate-changing state.

17. The signal transmission system according to claim 16, wherein the link adjustment circuit of the retimer further comprises a link equalization control circuit;

the link status circuit is further configured to determine, based on the link status information, that the link is in an equalized state; and the link equalization control circuit is configured to control the link to perform equalization adjustment in response to the link status circuit determining that the link is in the equalized state.

* * * * *